United States Patent
Furukawa (10) Patent No.: US 7,228,194 B2
(45) Date of Patent: Jun. 5, 2007

(54) POWER SUPPLY SYSTEM, POWER SUPPLY METHOD AND LOT PROCESSING METHOD

(75) Inventor: Shinichi Furukawa, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 6 days.

(21) Appl. No.: 11/495,629

(22) Filed: Jul. 31, 2006

(65) Prior Publication Data
US 2007/0050093 A1 Mar. 1, 2007

(30) Foreign Application Priority Data
Aug. 26, 2005 (JP) .............................. 2005-245847

(51) Int. Cl.
*G06F 19/00* (2006.01)
(52) U.S. Cl. .................. 700/121; 700/112; 700/295; 700/297
(58) Field of Classification Search .................. 700/22, 700/95, 96, 99, 103, 111, 112, 286, 295, 297, 700/300; 438/14
See application file for complete search history.

(56) References Cited

U.S. PATENT DOCUMENTS

| | | | |
|---|---|---|---|
| 6,035,245 A * | 3/2000 | Conboy et al. ............. | 700/112 |
| 6,351,686 B1 * | 2/2002 | Iwasaki et al. ............. | 700/121 |
| 6,356,804 B1 * | 3/2002 | Conboy et al. ............. | 700/112 |
| 6,535,778 B2 * | 3/2003 | Okabe et al. ............... | 700/121 |
| 6,720,194 B1 | 4/2004 | Miller et al. | |
| 6,748,287 B1 * | 6/2004 | Hagen et al. ............... | 700/100 |
| 7,027,885 B1 * | 4/2006 | Barto et al. ................. | 700/121 |
| 2005/0010311 A1 * | 1/2005 | Barbazette et al. .......... | 700/20 |

FOREIGN PATENT DOCUMENTS

| | | |
|---|---|---|
| JP | 2002-231596 | 8/2002 |
| JP | 2004-200485 | 7/2004 |

* cited by examiner

*Primary Examiner*—Leo Picard
*Assistant Examiner*—Charles Kasenge
(74) *Attorney, Agent, or Firm*—Finnegan, Henderson, Farabow, Garrett & Dunner, L.L.P.

(57) ABSTRACT

A power supply system is disclosed. The system includes a power supply unit which supplies power to a processing unit, an arrival time calculating portion which calculates arrival time taken for a lot to arrive at the processing unit from a present position based on the state of the lot, a comparing portion which compares the arrival time with start-up time of the processing unit, and a supply control portion which controls the power supply unit. The supply control portion causes operation power to be supplied to the processing unit when the arrival time is equal to or shorter than the start-up time and causes saving power which is smaller than the operation power to be supplied to the processing unit when the arrival time is longer than the start-up time.

15 Claims, 7 Drawing Sheets

POWER SUPPLY SYSTEM, POWER SUPPLY METHOD AND LOT PROCESSING METHOD

CROSS-REFERENCE TO RELATED APPLICATIONS

This application is based upon and claims the benefit of priority from prior Japanese Patent Application No. 2005-245847, filed Aug. 26, 2005, the entire contents of which are incorporated herein by reference.

BACKGROUND OF THE INVENTION

1. Field of the Invention

This invention relates to the lot processing technology and more particularly to a power supply system, power supply method and lot processing method.

2. Description of the Related Art

At present, the power consumption used in a semiconductor manufacturing factory is large. Therefore, it is desired to suppress the power consumption from the viewpoint of a cost reduction and protection of the environment.

Conventionally, as a power saving method, a method for setting a processing unit into an energy saving mode when the standby time of the processing unit becomes longer than a preset time is known (for example, refer to Jpn. Pat. Appln. KOKAI Publication No. 2004-200485). However, once the processing unit is set in the power saving state, it takes a long time as the start-up time required for restoring the processing unit to an operative state in order to process the next lot. Therefore, the process cannot be instantly started even if the lot arrives at the processing unit, and throughput is lowered. At present, it is difficult to attain power saving operation without lowering the throughput.

BRIEF SUMMARY OF THE INVENTION

According to a first aspect of this invention, there is provided a power supply system which comprises a processing unit, a power supply unit which supplies power to the processing unit, a lot specifying portion which specifies the state of a lot to be processed by the processing unit, an arrival time calculating unit which calculates arrival time taken for the lot to arrive at the processing unit from the present position based on the state of the lot, a comparing portion which compares the arrival time with start-up time of the processing unit, and a supply control portion which controls the power supply unit to supply operation power used to operate the processing unit to the processing unit when the arrival time is not longer than the start-up time and supply saving power which is smaller than the operation power to the processing unit when the arrival time is longer than the start-up time.

According to a second aspect of this invention, there is provided a power supply method comprising specifying the state of a lot to be processed by a processing unit, calculating arrival time taken for the lot to arrive at the processing unit from the present position based on the state of the lot, comparing the arrival time with start-up time of the processing unit, supplying operation power used to operate the processing unit to the processing unit when the arrival time is not longer than the start-up time, and supplying saving power smaller than the operation power to the processing unit when the arrival time is longer than the start-up time.

According to a third aspect of this invention, there is provided a lot processing method comprising specifying the state of a lot to be processed by a processing unit, calculating arrival time taken for the lot to arrive at the processing unit from the present position based on the state of the lot, comparing the arrival time with start-up time of the processing unit, supplying operation power used to operate the processing unit to the processing unit when the arrival time is not longer than the start-up time, supplying saving power smaller than the operation power to the processing unit when the arrival time is longer than the start-up time, and processing the lot by use of the processing unit.

DETAILED DESCRIPTION OF THE INVENTION

There will now be described embodiments of this invention with reference to the accompanying drawings. In the description of the accompanying drawings, the same or similar portions are denoted by the same or similar reference symbols. However, the drawings are schematically shown. Further, the following embodiments are devices and methods for embodying the technical idea of this invention as examples and the materials, shapes, structures, arrangements and the like of the constituents in the technical idea of this invention are not limited to those described below. The technical idea of this invention can be variously modified in the claims.

Figure 1:
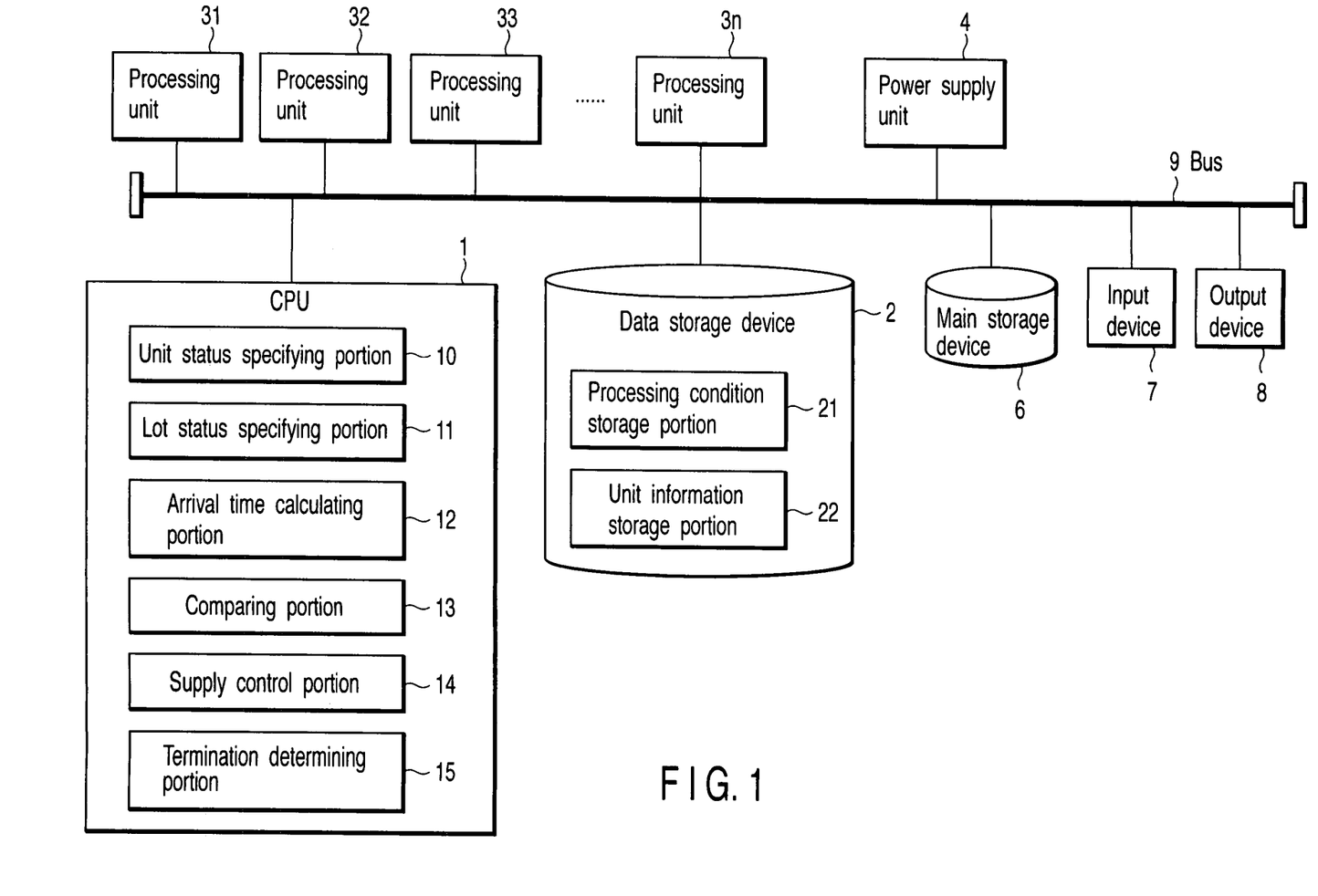
FIG. 1 is a block diagram showing one example of a power supply system according to an embodiment of this invention.

As shown in FIG. 1, a power supply system (semiconductor manufacturing system) according to an embodiment of this invention includes processing units 31, 32, 33, ..., 3n, lot specifying portion 11, arrival time calculating portion 12, comparing portion 13 and supply control portion 14. A power supply unit 4 supplies power to the processing units 31, 32, 33, ..., 3n. The lot specifying portion 11 specifies the state of a lot to be processed by the processing units 31, 32, 33, ..., 3n. The arrival time calculating portion 12 calculates arrival time taken for the lot to arrive at the processing units 31, 32, 33, ..., 3n from the present position based on the state of the lot. The comparing portion 13 compares the arrival time with the start-up time of the processing units 31, 32, 33, . . . , 3n. The supply control portion 14 controls the power supply unit 4 to supply operation power used to operate the processing units 31, 32, 33, . . . , 3n to the processing units 31, 32, 33, . . . , 3n when the arrival time is not longer than the start-up time. On the other hand, if the arrival time is longer than the start-up time, the supply control portion 14 controls the power supply unit 4 to supply saving power which is smaller than the operation power to the processing units 31, 32, 33, . . . , 3n. The lot specifying portion 11, arrival time calculating portion 12, comparing portion 13 and supply control portion 14 of this example are contained in a module which is operated by a central operation processing unit (CPU) 1.

The CPU 1, the processing units 31, 32, 33, . . . , 3n, data storage device 2, power supply unit 4, main storage device 6, input device 7, output device 8 and the like are connected via a communication network such as a bus 9, the Internet, LAN or wireless LAN. By connecting the above units and devices via the communication network, adequate information can be obtained even from a remote location and information can be obtained on the real time basis.

The processing units 31, 32, 33, . . . , 3n of this example include various types of semiconductor manufacturing devices such as an ion-implantation device, impurity diffusion device, thermal oxidation device, chemical vapor deposition (CVD) device, heat treatment device, sputtering device, vacuum vapor deposition device, plating processing device, chemical/mechanical polishing (CMP) device, dry or wet etching device, cleaning device, spin coat device (spinner), exposure device, dicing device and bonding device, for example.

For example, the ion-implantation device ion-implants an impurity into a semiconductor substrate to form N-type or P-type semiconductor regions. For example, the impurity diffusion device diffuses an impurity implanted into the semiconductor substrate. For example, the thermal oxidation device forms a silicon oxide film ($SiO_2$ film) on the surface of the semiconductor substrate. For example, the chemical vapor deposition (CVD) device deposits $SiO_2$, phosphorus glass (PSG), boron glass (BSG), boron-phosphorus glass (BPSG), silicon nitride ($Si_3N_4$), polysilicon or the like. The heat treatment device is used to reflow (melt) the PSG film, BSG film or BPSG film formed on the semiconductor substrate, densify a film such as a CVD oxide film or react metal with silicon to form a silicide film. For example, the sputtering device and vacuum vapor deposition device form a metal layer used for formation of wiring layers on the semiconductor substrate by sputtering and vapor deposition. For example, the plating processing device forms a metal wiring layer on the semiconductor substrate by plating. The chemical/mechanical polishing (CMP) device polishes the surface of the semiconductor substrate. The dry or wet etching device etches the surface of the semiconductor substrate. The cleaning device cleans the surface of the semiconductor substrate, for example, the surface of the semiconductor substrate obtained after removing photoresist, for example. The spin coat device spin-coats photoresist on the surface of the semiconductor substrate in the photolithography step. The exposure device exposes the photoresist. The dicing device dices the semiconductor substrate into IC chips (semiconductor integrated circuit devices). The bonding device connects electrodes of the IC chip to lead frames.

Further, in the processing unit, auxiliary equipment such as a pure water processing unit or refnining unit may be provided. Further, the semiconductor manufacturing devices can be applied to either a batch processing type device or a single wafer processing type device. Likewise, all of the embodiments described later can be applied to the batch processing type device or the single wafer processing type device.

The power supply unit 4 supplies operation power used to operate the processing units 31, 32, 33, . . . , 3n to the processing units 31, 32, 33, . . . , 3n. The power supply unit 4 can supply saving power smaller than the operation power to the processing units 31, 32, 33, . . . , 3n. The start-up time is required for each of the processing units 31, 32, 33, . . . , 3n to be changed from the state in which the processing unit is supplied with saving power to the operative state in which it is supplied with operation power to process a lot.

The data storage device 2 includes a processing condition storage portion 21 and unit information storage portion 22. The processing condition storage portion 21 stores the processing condition of a lot to be processed by the processing units 31, 32, 33, . . . , 3n. The unit information storage portion 22 stores a specification such as the start-up times of the processing units 31, 32, 33, . . . , 3n.

The CPU 1 of this example includes a unit specifying portion 10, lot specifying portion 11, arrival time calculating portion 12, comparing portion 13, supply control portion 14 and termination determining portion 15. The unit specifying portion 10 determines whether the processing units 31, 32, 33, 3n are set in an operative state in which the lot can be processed or in a non-operative state in which periodic unit quality control (QC) and maintenance are contained and specifies the state of the processing units 31, 32, 33, . . . , 3n. Further, in the operative state, it determines whether the processing units are set in a state in which lots are being processed or in a standby state.

Figure 7:
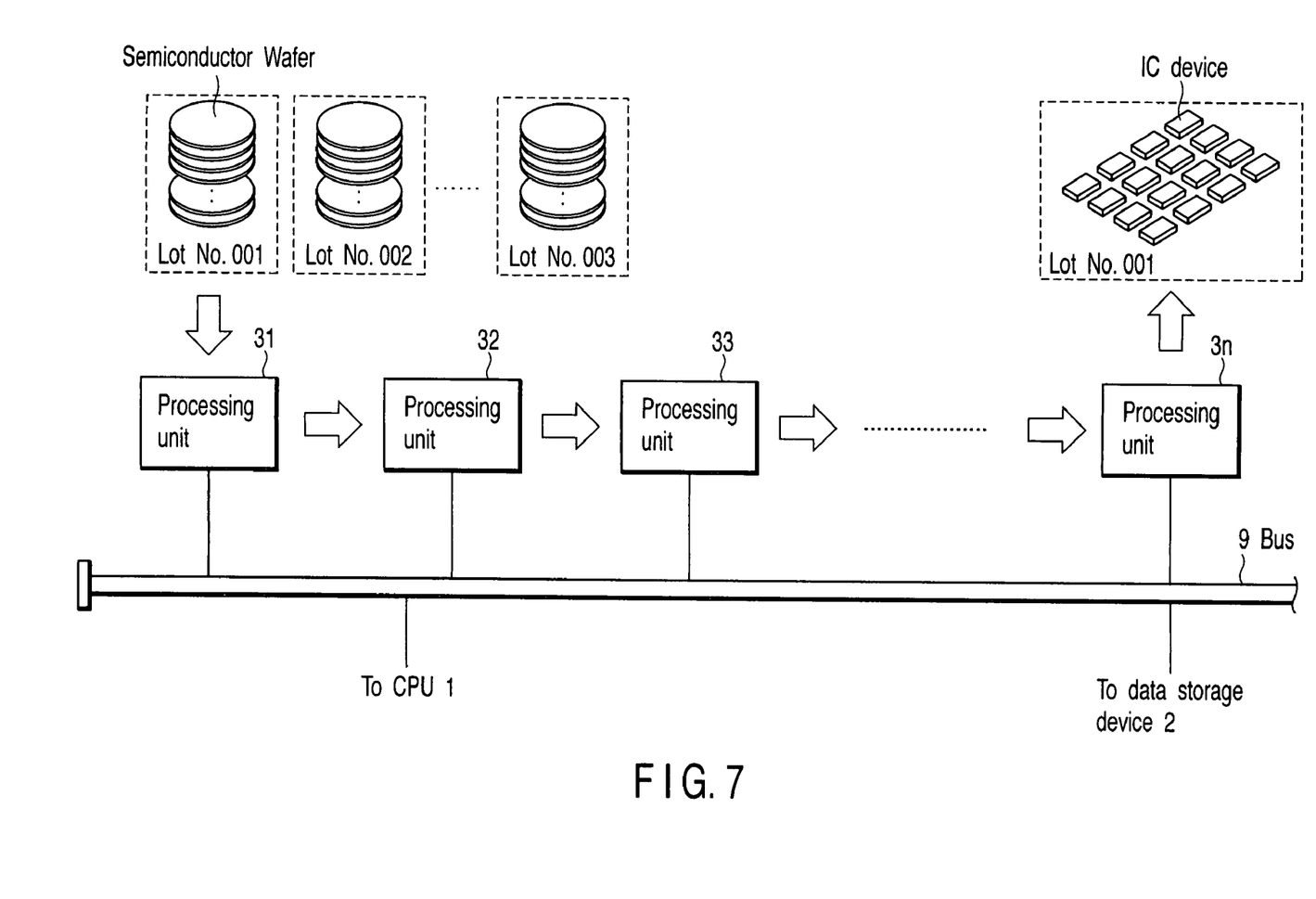
FIG. 7 is a diagram showing one example of a flow of a lot.

The lot specifying portion 11 specifies the state of a lot to be next processed by the processing unit 33 which is an object unit. For example, whether a next lot is being processed by another processing unit 32 lying immediately before the processing unit 33, a lot is being processed by still another processing unit 31 lying further before the processing unit 33, it is being transferred or it is being stored is determined. For example, it is assumed that the lot is set in a state set before processing by the processing unit 31. After this, a case where the processing unit 33 is used as an object unit is explained. In FIG. 7, one example of the flow of a lot is shown. As shown in FIG. 7, a lot including a preset number of sheets, for example, 100 semiconductor wafers is first placed in the processing unit 31. After this, the semiconductor wafers of the lot are sequentially processed in the order of the processing units 31, 32, 33, . . . , 3n and finally formed into IC units.

The arrival time calculating portion 12 calculates arrival time taken for the lot to arrive at the processing unit 33 from the present position based on the processing condition of the lot stored in the processing condition storage portion 21, the specifications of the processing units 31, 32 stored in the unit information storage portion 22 and the state of the lot specified by the lot specifying portion 11. The arrival time calculating portion 12 calculates processing time in the processing units 31, 32 before the processing unit 33 which is an object unit at the present time and transferring time of the lot between the processing units 31, 32 and 33.

The comparing portion 13 reads out start-up time of the processing unit 33 stored in the unit information storage portion 22 and compares the arrival time calculated by the arrival time calculating portion 12 with the start-up time of the processing unit 33.

The supply control portion 14 controls the power supply unit 4 and adjusts electric power from the power supply unit 4 to the processing unit 33. For example, if it is detected that the arrival time is not longer than the start-up time as the result of comparison by the comparing portion 13, it controls the power supply unit 4 to supply the operation power used to operate the processing unit 33 to the processing unit 33. In this case, it causes the power supply unit 4 to maintain supply of the operation power when the processing unit 33 is supplied with operation power in the standby state or during the lot processing operation. Further, when saving power is supplied to the processing unit 33 for periodic quality control (QC) or maintenance of the unit, the saving power is switched to operation power and the operation power is supplied.

Since no useless time occurs if a lot arrives at each of the processing units 31, 32, 33, ... , 3n at the same time as a corresponding one of the processing units 31, 32, 33, ... , 3n is triggered and set into the operative state, it is preferable to switch the saving power to the operation power when the arrival time is equal to the start-up time.

On the other hand, the power supply unit 4 is controlled to supply saving power smaller than the operation power to the processing unit 33 when the arrival time is longer than the start-up time. In this case, if the operation power has been supplied to the processing unit 33, the supply control portion causes the power supply unit 4 to switch the operation power to the saving power and supply the saving power. Further, if the saving power has been supplied to the processing unit 33, it causes the power supply unit 4 to maintain supply of the saving power.

The CPU 1 includes a storage unit management device (not shown). When an input/output operation is required between the storage units, the read/write process for a necessary file is performed via the storage unit management device. In this case, the CPU 1 may be incorporated into a unit such as the processing unit 33 or provided outside the unit.

As the input device 7, for example, a special device such as a keyboard, mouse, OCR, a pattern input device such as an image scanner, or a special input device such as an audio input device can be used. As the output device 8, a display device such as a liquid crystal display, CRT display, or a printing device such as an ink jet printer, laser printer can be used.

In the main storage unit 6, a ROM and RAM are incorporated. The ROM functions as a program storage device which stores programs executed by the CPU 1 (the program will be described later in detail). The RAM functions as a temporary data memory which temporarily stores data and the like used during the program execution time in the CPU 1 and is used as a work area. As the main storage device, for example, a semiconductor memory, magnetic disk, optical disk, magneto-optical disk or magnetic tape can be used. Further, it includes an input/output control device (interface) which connects the input device and output device to the CPU 1 although not shown in the drawing.

Figure 8:
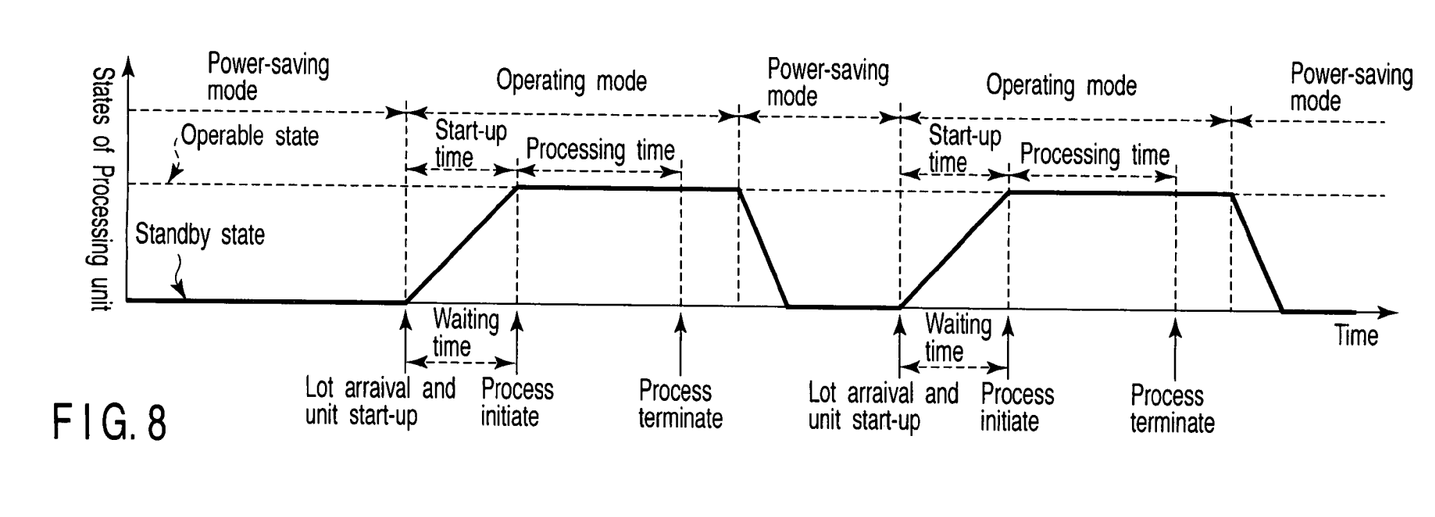
FIG. 8 is a timing chart showing how the processing unit operates, using a power-supply system having a typical power-saving mode.
Figure 9:
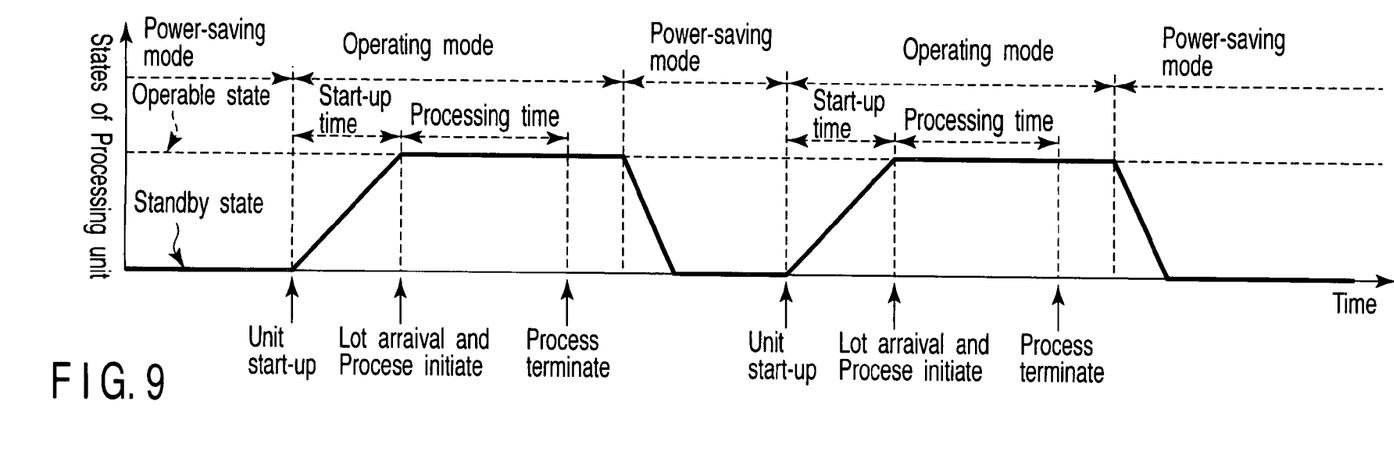
FIG. 9 is a timing chart showing how the processing unit operates, when using a power-supply system according to this embodiment.

FIG. 8 is a timing chart showing how the processing unit operates, using a power-supply system having a typical power-saving mode. FIG. 9 is a timing chart showing how the processing unit operates, when using a power-supply system according to this embodiment.

As shown in FIG. 8, the power-supply system having a typical power-saving mode remains in a power-saving state or a standby state until a lot arrives at the processing unit. Assume that the power-supply system remains in the standby state. In this case, the power-supply system starts up the processing unit when a lot arrives at the process unit. Upon lapse of the start-up time, the processing unit assumes an operative state or an operable state. Assume that the processing unit assumes the operable state. After it assumes the operable state, the process unit initiates the processing of the lot. Thus, the start-up time is the waiting time.

In the power-supply system according to this embodiment, the processing unit is set in a power-saving state or a standby state in the same way as in the power-supply system that has the typical power-saving mode. Nonetheless, the system of this embodiment estimates a time the lot arrives at the processing unit, and starts up the processing unit the start-up time or a longer time before the estimated time of lot arrival. The processing unit has therefore already assumed an operative state or an operable state when the lot arrives at it. Hence, the processing unit can start processing the lot at the same time the lot arrives at it. Thus, there is no lot-waiting time in the power-supply system according to this embodiment. This increases the throughput of the system. The power-supply system can of course save power as the power-supply system that has the typical power-saving mode.

That is, the power-supply system according to this embodiment can save power, without decreasing the throughput.

When the operating state of the processing unit is switched from the power-saving or standby state to the operative or operable state, the power supplied to the processing unit is increased either continuously or stepwise. When the operating state of the processing unit is switched the other way around, too, the power supplied to the processing unit is increased either continuously or stepwise.

Next, the power supply method according to the embodiment of this invention is explained with reference to the flowchart shown in FIG. 2.

It is assumed that the power supply unit 4 shown in FIG. 1 maintains supply of operation power to the processing units 31, 32, 33, ... , 3n in step S10. In step S11, the unit specifying portion 10 determines whether or not the processing unit 33 which is an object unit is performing a lot processing operation. If the lot processing operation is being performed, the process is returned to step S10 and supply of the operation power to the processing unit 33 which is the object unit is maintained. If it is determined in step S11 that the lot processing operation is not being performed, step S12 is performed.

In step S12, the termination determining portion 15 determines whether or not all of the lot processing operations are terminated. If all of the lot processing operations are terminated, step S13 is performed to interrupt supply of power to the processing unit 33 which is the object unit. If it is detected in step S12 that there remains at least one lot processing operation which is not terminated, step S14 is performed.

In step S14, the lot specifying portion 11 specifies the state of a lot to be next processed in the processing unit 33 which is the object unit. In step S15, the arrival time calculating portion 12 calculates arrival time taken for the lot to arrive at the processing unit 33 which is the object unit from the present position by taking the transfer time between the processing units 31, 32, 33 and the processing time in the other processing units 31, 32 based on the state of the lot specified by the lot specifying portion 11, the processing condition stored in the processing condition storage portion 21 and the specifications of the processing units 31, 32, 33 stored in the unit information storage portion 22.

In step S16, the comparing portion 13 compares the arrival time calculated by the arrival time calculating portion 12 with start-up time of the processing unit 33 of the object unit which is stored in the unit information storage portion 22. If the arrival time is equal to or shorter than the start-up time, the process is returned to step S10 and supply of the operation power is maintained. If it is determined in step S16 that the arrival time is longer than the start-up time, step S17 is performed and the supply control portion 14 changes the operation power to the saving power and supplies the saving power to the processing unit 33 which is the object unit.

In step S18, the lot specifying portion 11 specifies the state of a lot to be next processed in the processing unit 33 which is the object unit. In step S19, the arrival time calculating portion 12 calculates arrival time taken for the lot to arrive at the processing unit 33 which is the object unit based on the state of the lot specified by the lot specifying portion 11, the processing condition stored in the processing condition storage portion 21 and the specifications of the processing units 31, 32, 33 stored in the unit information storage portion 22.

In step S20, the comparing portion 13 compares the arrival time calculated by the arrival time calculating portion 12 with the start-up time of the processing unit 33 of the object which is stored in the unit information storage portion 22. If it is determined in step S20 that the arrival time is longer than the start-up time, step S21 is performed, the supply control portion 14 maintains supply of the saving power and the process is returned to step S18. If the arrival time is equal to or shorter than the start-up time, step S22 is performed and the supply control portion 14 causes the power supply unit 4 to change the saving power to the operation power and supply the operation power to the processing unit 33.

According to the present embodiment of this invention, the processing unit to which a lot to be processed is not transferred for a long period can be operated with electric power set lower than the operation power, power consumption can be suppressed, the cost can be lowered and the degree of protection of the environment can be enhanced by calculating the arrival time taken for the lot to arrive at the processing unit 33 in the lot processing system used in the semiconductor manufacturing line or the like.

Further, a case where the processing unit 31 is used as an object unit is explained. However, the units can be operated with the smooth linkage between the respective units and the throughput can be maintained by performing the control operation and integrated control operation of supply of power by using a plurality of processing units 31, 32, 33, ..., 3n of the manufacturing line as object units.

The state of the lot is specified in step S18 and the arrival time is calculated in step S19. However, the processes of steps S18 and S19 can be omitted. In this case, in step S20, the comparing portion 13 may compare the arrival time with the start-up time by using the arrival time calculated in step S15.

Figure 2:
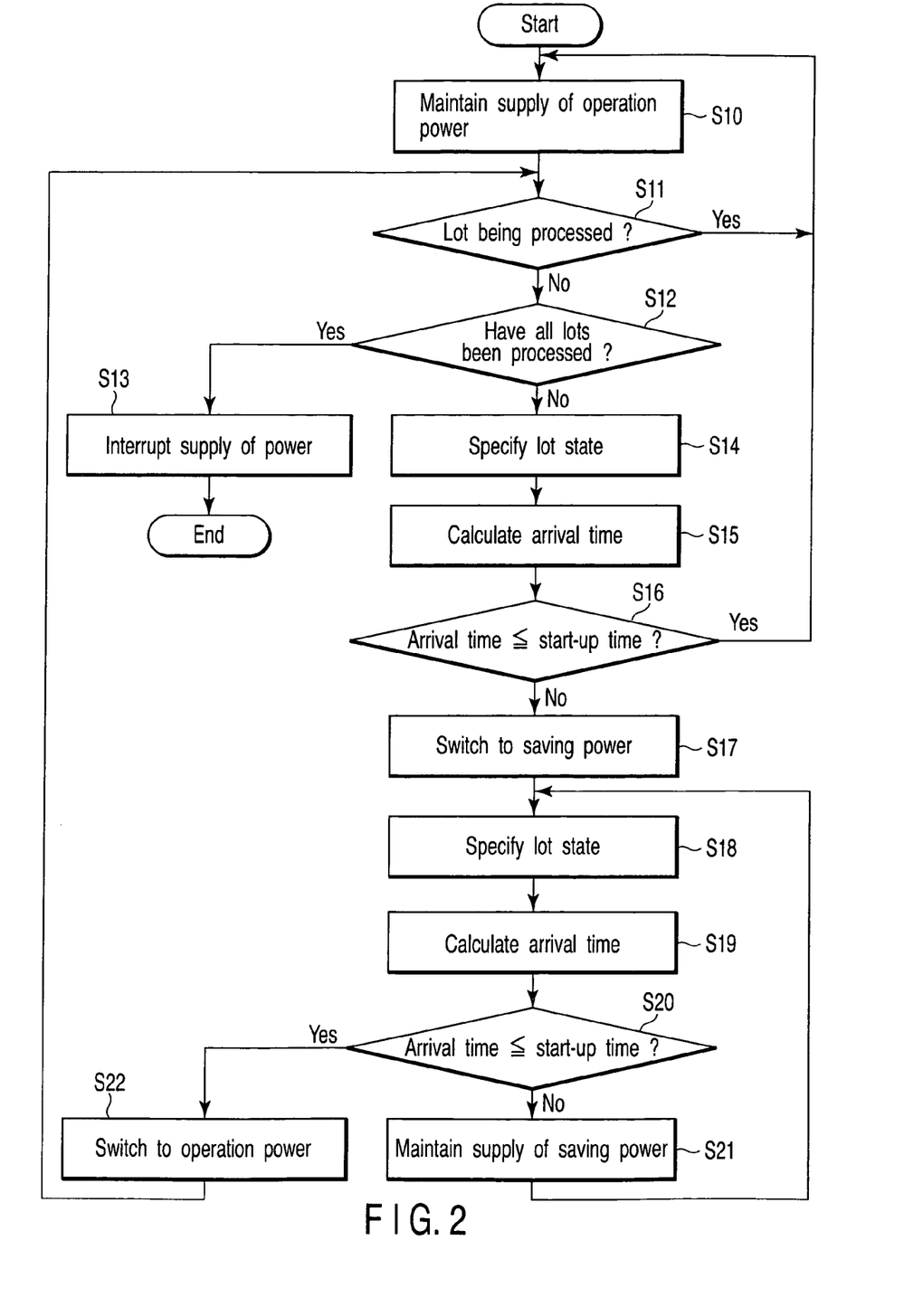
FIG. 2 is a flowchart for illustrating one example of a power supply method according to an embodiment of this invention.

A sequence of processes shown in FIG. 2 can be realized by controlling the lot processing system shown in FIG. 1 by use of a program of the algorithm equivalent to that of FIG. 2. The program may be stored in the main storage device or the like of a computer system which configures the lot processing system of this invention. Further, a sequence of the processes of the present embodiment in this invention can be realized by storing the program in a recording medium which can be read by the computer and reading the recording medium into the main storage device of the lot processing system. In this case, the "recording medium which can be read by the computer" indicates a medium such as an external memory device of the computer, semiconductor memory, magnetic disk, optical disk, magneto-optical disk or magnetic tape, for example, which can record programs. Specifically, a flexible disk, CD-ROM, MO disk and the like are contained in the "recording medium which can be read by the computer". For example, the main body of the lot processing system can be configured to contain a flexible disk device (flexible disk drive) and optical disk device (optical disk drive) or configured to be externally connected to the above devices. A flexible disk is inserted into the flexible disk drive and a CD-ROM is inserted into the optical disk drive via an insertion port thereof and a preset read operation is performed so as to install the programs stored in the recording media into the main storage device configuring the lot processing system. Further, for example, a ROM or magnetic tape device can be used by connecting a preset drive device to the lot processing system. Also, the program can be stored in the main storage device via a communication network such as Internet.

Figure 3:
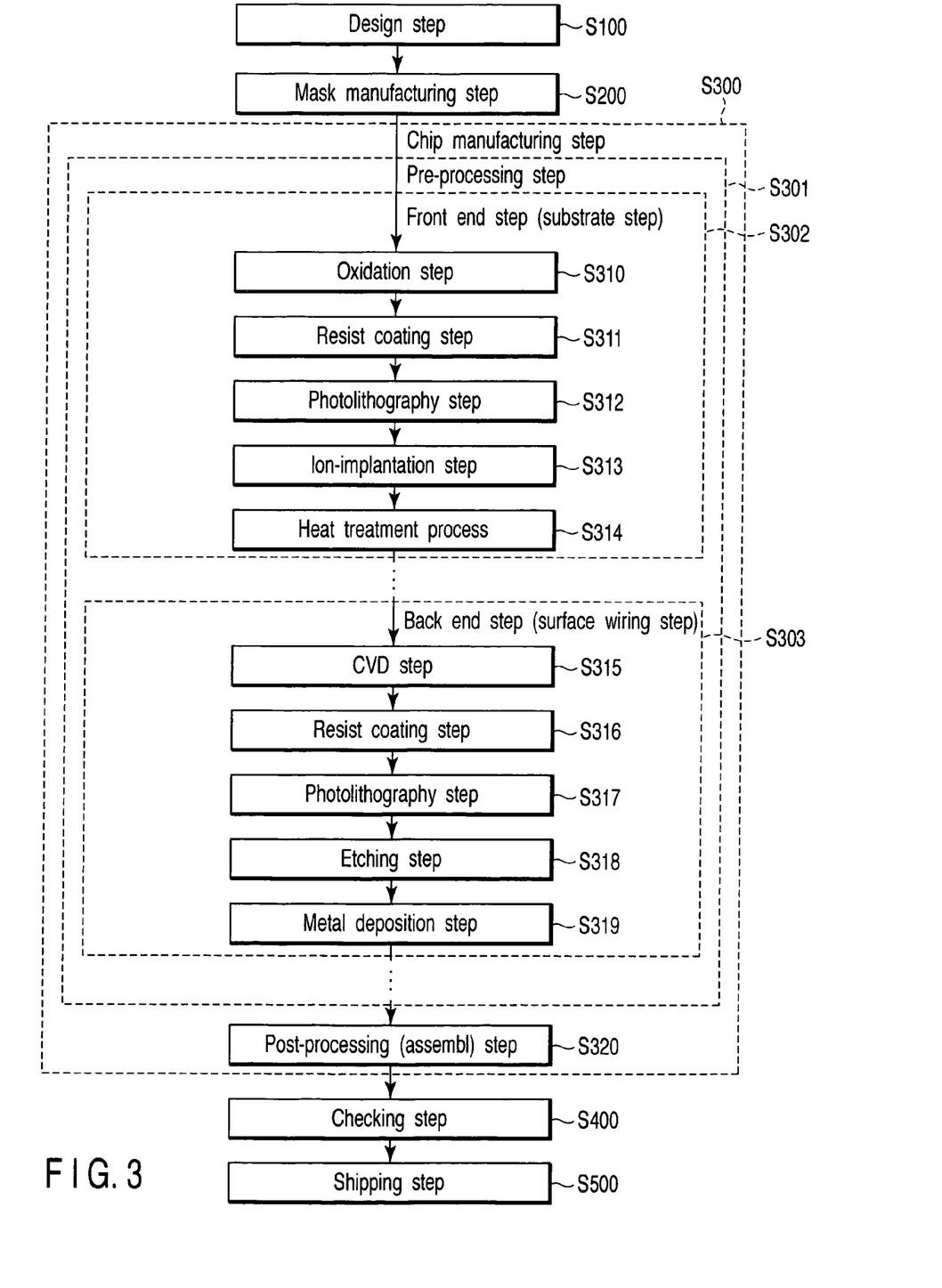
FIG. 3 is a flowchart for illustrating one example of a lot processing method (semiconductor unit manufacturing method) according to an embodiment of this invention.

Next, a manufacturing method (lot processing method) of a semiconductor integrated circuit (LSI) according to an embodiment of this invention is explained with reference to the flowchart shown in FIG. 3. The manufacturing method of the semiconductor storage device described below is explained as one example and can be realized by use of the present example and other various manufacturing methods.

(a) First, in step S100, an electrical characteristic is acquired by process simulation/lithography simulation and device simulation. Circuit simulation of an LSI is performed by use of the electrical characteristic to form layout data (design data) of a design pattern.

(b) Next, in step S210, mask data of a mask pattern is formed for the design pattern of the layout data formed in step S100. A mask pattern is formed on a mask substrate to form a photomask. The photomask is formed for each of the layers corresponding to the respective steps of the LSI manufacturing process and thus a set of photomasks are prepared.

(c) The oxidation step in step S310, resist coating step in step S311, photolithography step in step S312, ion-implantation step in the step S313, heat treatment step in step S314 and the like are repeatedly performed for every plural lots by use of the corresponding processing units 31, 32, 33, ..., 3n in the front end step (substrate step) in step S302. At this time, operation power and saving power supplied to the processing units 31, 32, 33, ..., 3n in which the lots are processed are controlled according to the process of steps S10 to S22 of FIG. 2. When a sequence of the steps is terminated, step S303 is performed.

(d) In step S303, the back end step (surface wiring step) in which the substrate surface is subjected to the wiring process is performed. In the back end step, the chemical vapor deposition (CVD) step in step S315, resist coating step in step S316, photolithography step in step S317, etching step in S318, metal deposition step in step S319 and the like are repeatedly performed for every plural lots by use of the corresponding processing units 31, 32, 33, 3n. At this time, operation power and saving power supplied to the processing units 31, 32, 33, ..., 3n in which the lots are processed are controlled according to the process of steps S10 to S22 of FIG. 2. When a multi-layered wiring structure is completed by performing a sequence of the steps, step S304 is performed.

(e) In step S304, the wafer is divided into chips with preset chip size by use of a dicing device such as a diamond blade. Then, the chip is mounted on a packaging material such as metal or ceramics, electrodes on the chip are connected to leads of a lead frame via metal wires, and then a preset package assembling step such as a resin sealing step is performed. In step S400, a semiconductor integrated circuit is completed by performing a preset checking process such as a characteristic checking process for the performance and function of a semiconductor integrated circuit and a checking process for the lead shape, size and reliability experiments. In step S500, the semiconductor integrated circuit which has been subjected to the above steps without causing any problem is wrapped so as to be protected from water, static electricity and the like and then shipped.

As described above, according to the manufacturing method of the semiconductor storage device according to the embodiment of this invention, for example, the power consumption can be lowered without lowering the throughput by controlling the operation power and saving power supplied to the processing units $31, 32, 33, \ldots, 3n$ in steps S302 and S303.

(First Modification)

In the first modification of the embodiment of this invention, the supply control portion 14 shown in FIG. 1 can control the power supply unit 4 to adjust the amount of power in stages.

The supply control portion 14 calculates a difference between the arrival time and the start-up time of the unit and supplies electric power which is ½ or ⅓ times the operation power as the saving power according to the thus calculated difference. As the amount of power supplied to the processing units $31, 32, 33, \ldots, 3n$ is smaller, longer start-up time taken to restore the operative state becomes necessary.

According to the first modification of the embodiment of this invention, the degree of freedom of supply of power can be enhanced and power saving can be attained by gradually adjusting the power supplied to the processing units $31, 32, 33, \ldots, 3n$.

(Second Modification)

Figure 4:
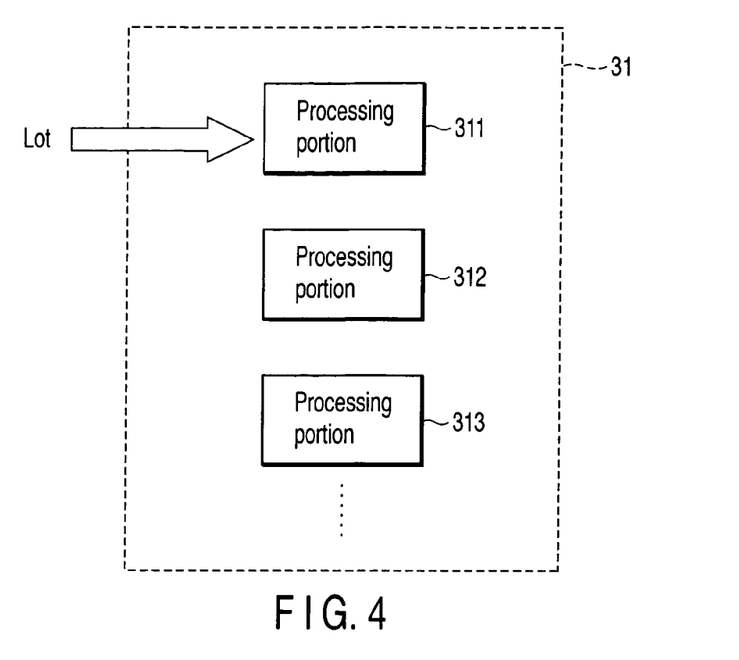
FIG. 4 is a block diagram showing one example of a processing unit according to a second modification of the embodiment of this invention.

In the second modification of the embodiment of this invention, for example, as shown in FIG. 4, the processing unit 31 includes a plurality of processing portions $311, 312, 313, \ldots$. Each of the processing portions $311, 312, 313, \ldots$ is a chamber having a pump, for example. When only the processing portion 311 is used to process a lot and the processing portions $312, 313, \ldots$ are not used, the pump of the processing portion 312 can be driven by use of the operation power and the pumps of the processing portions $312, 313, \ldots$ can be operated by use of the saving power. The supply control portion 14 permits the operation power to be supplied only to the processing portion 311 among the plurality of processing portions $311, 312, 313, \ldots$ which is used to process the lot. At this time, the supply control portion 14 permits the saving power to be supplied to the processing portions $312, 313, \ldots$.

According to the second modification of the embodiment of this invention, the degree of freedom of supply of power can be enhanced and power saving can be attained by individually controlling the amounts of power respectively supplied to the plurality of processing portions $311, 312, 313, \ldots$.

(Third Modification)

Figure 5:
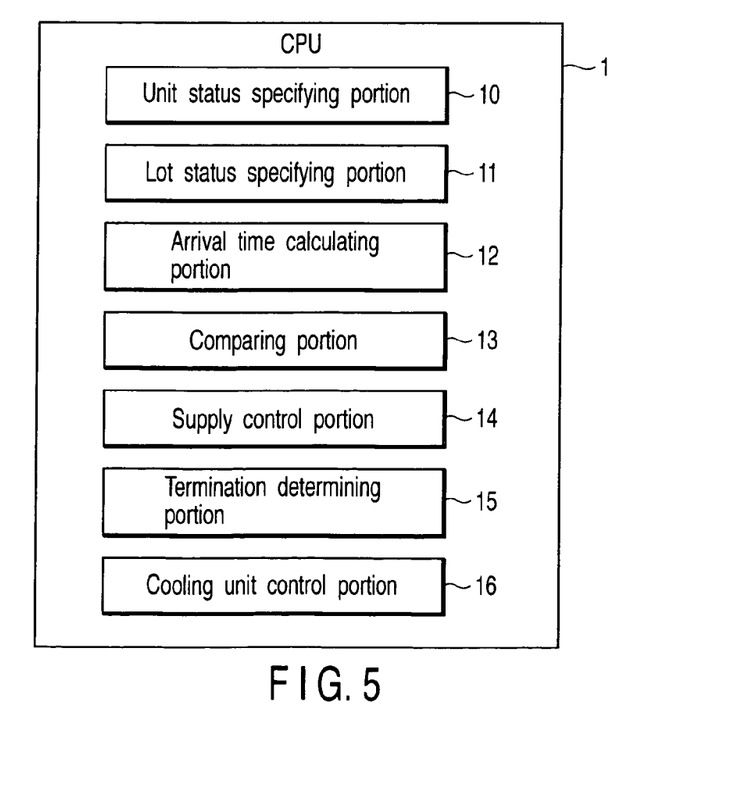
FIG. 5 is a block diagram showing one example of a central operation processing unit according to a third modification of the embodiment of this invention.
Figure 6:
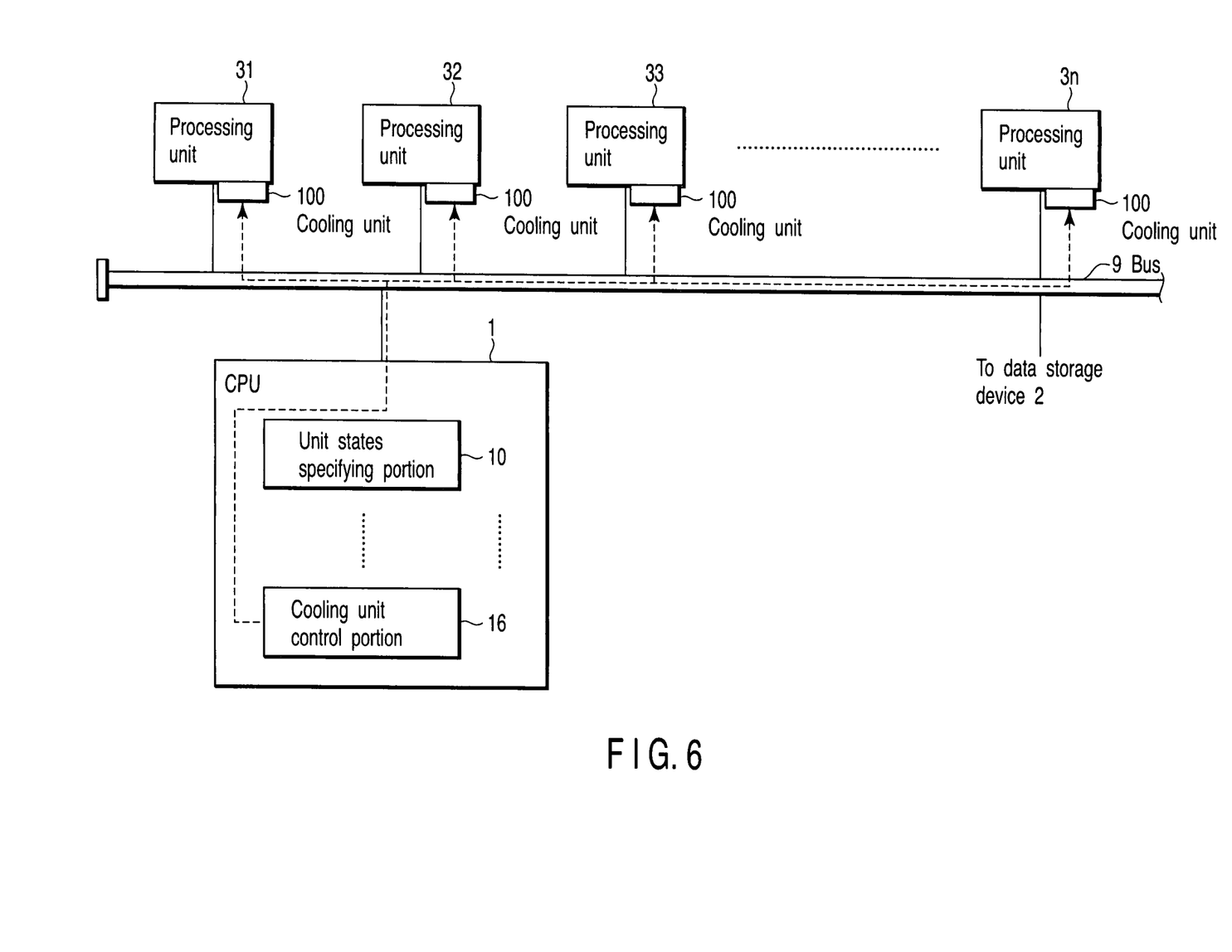
FIG. 6 is a block diagram showing one example of a power supply system according to a third modification of the embodiment of this invention.

In the third modification of the embodiment of this invention, as shown in FIG. 5, the CPU 1 may include a cooling unit control portion 16. As shown in FIG. 6, the cooling unit control portion 16 controls cooling units 100 provided in the respective processing units $31, 32, 33, \ldots, 3n$. One concrete example of the control operation is that the cooling unit control portion 16 adjusts the amount of cooling water used to cool the processing units $31, 32, 33, \ldots, 3n$ based on the arrival time of the lot and the start-up times of the processing units $31, 32, 33, \ldots, 3n$ shown in FIG. 1 together with the operation of controlling supply of power by the supply control portion 14. For example, when the saving power is supplied to the processing units $31, 32, 33, \ldots, 3n$, the amount of cooling water to the processing units $31, 32, 33, \ldots, 3n$ is reduced. On the other hand, when the operation power is supplied to the processing units $31, 32, 33, \ldots, 3n$, the amount of cooling water to the processing units $31, 32, 33, \ldots, 3n$ is increased.

According to the third modification of the embodiment of this invention, the cost can be reduced and the degree of protection of the environment can be enhanced by controlling the amount of cooling water together with the amount of power.

OTHER EMBODIMENTS

As described above, this invention is explained with reference to the embodiment, but it should not be understood that the description and the drawings configuring part of the disclosure do not limit this invention. Based on the disclosure, various modifications, embodiments and embodying technique will become obvious for those skilled in the art.

For example, for simplicity, a case wherein there is no shutdown time in which the state of the processing units $31, 32, 33, \ldots, 3n$ is changed from the operative state to the power saving state is explained. However, the power switching operation can be performed by taking the shutdown time into consideration. For example, in the case of the operative state, supply of the operation power can be maintained when the arrival time is equal to or shorter than the sum of the start-up time and shutdown time and the operation power may be changed to the saving power when the arrival time is longer than the sum of the start-up time and shutdown time.

Thus, the invention contains various embodiments which are not described here. Therefore, the technical scope of this invention can be determined only by the specified items of this invention associated with the adequate claims based on the above description.

According to the embodiments of this invention, a power supply system, power supply method and lot processing method which can attain power saving without lowering the throughput can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power supply system comprising:
a processing unit,
a power supply unit which supplies power to the processing unit,
a lot specifying portion which specifies a state of a lot to be processed by the processing unit,
an arrival time calculating unit which calculates arrival time taken for the lot to arrive at the processing unit from a present position based on the state of the lot,
a comparing portion which compares the arrival time with start-up time of the processing unit, and a supply control portion which controls the power supply unit to supply operation power used to operate the processing unit to the processing unit when the arrival time is not longer than the start-up time and supply saving power which is smaller than the operation power to the processing unit when the arrival time is longer than the start-up time.

2. The power supply system according to claim 1, wherein the supply control portion adjusts the saving power in stages according to a difference between the arrival time and the start-up time.

3. The power supply system according to claim 1, wherein the processing unit includes a plurality of processing portions and the supply control portion supplies the operation power to one of the plurality of processing portions of the processing unit which processes the lot.

4. The power supply system according to claim 1, wherein the supply control portion supplies the operation power to one of the plurality of processing portions of the processing unit which processes the lot.

5. The power supply system according to claim 1, wherein the processing unit includes a cooling unit and a cooling unit control portion which controls the cooling unit, the cooling unit control portion adjusting cooling capacity of the cooling unit based on the arrival time of the lot and the start-up time of the processing unit.

6. A power supply method comprising:
specifying a state of a lot to be processed by a processing unit,
calculating arrival time taken for the lot to arrive at the processing unit from a present position based on the state of the lot,
comparing the arrival time with start-up time of the processing unit,
supplying operation power used to operate the processing unit to the processing unit when the arrival time is not longer than the start-up time, and
supplying saving power smaller than the operation power to the processing unit when the arrival time is longer than the start-up time.

7. The power supply method according to claim 6, wherein the supplying of the saving power to the processing unit is adjusting the saving power in stages according to a difference between the arrival time and the start-up time.

8. The power supply method according to claim 6, wherein the processing unit includes a plurality of processing portions and the supply control portion supplies the operation power to one of the plurality of processing portions of the processing unit which processes the lot.

9. The power supply method according to claim 7, wherein the supply control portion supplies the operation power to one of the plurality of processing portions of the processing unit which processes the lot.

10. The power supply method according to claim 6, further comprising adjusting cooling capacity of the processing unit based on the arrival time of the lot and the start-up time of the processing unit.

11. A lot processing method comprising:
specifying a state of a lot to be processed by a processing unit,
calculating arrival time taken for the lot to arrive at the processing unit from a present position based on the state of the lot,
comparing the arrival time with start-up time of the processing unit,
supplying operation power used to operate the processing unit to the processing unit when the arrival time is not longer than the start-up time,
supplying saving power smaller than the operation power to the processing unit when the arrival time is longer than the start-up time, and
processing the lot by use of the processing unit.

12. The lot processing method according to claim 11, wherein the supplying of the saving power to the processing unit is adjusting the saving power in stages according to a difference between the arrival time and the start-up time.

13. The lot processing method according to claim 11, wherein the processing unit includes a plurality of processing portions and the supply control portion supplies the operation power to one of the plurality of processing portions of the processing unit which processes the lot.

14. The lot processing method according to claim 12, wherein the supply control portion supplies the operation power to one of the plurality of processing portions of the processing unit which processes the lot.

15. The lot processing method according to claim 11, further comprising adjusting cooling capacity of the processing unit based on the arrival time of the lot and the start-up time of the processing unit.

* * * * *